(12) United States Patent
Duan et al.

(10) Patent No.: US 11,982,432 B2
(45) Date of Patent: May 14, 2024

(54) LIGHT EMITTING MODULE FOR SPOTLIGHT AND SPOTLIGHT

(71) Applicant: ZHONGSHAN DASHAN PHOTOGRAPHIC EQUIPMENT CO., LTD., Zhongshan (CN)

(72) Inventors: Jinhua Duan, Zhongshan (CN); Xihua Zhu, Zhongshan (CN)

(73) Assignee: ZHONGSHAN DASHAN PHOTOGRAPHIC EQUIPMENT CO., LTD., Zhongshan (CN)

( * ) Notice: Subject to any disclaimer, the term of this patent is extended or adjusted under 35 U.S.C. 154(b) by 0 days.

(21) Appl. No.: 18/057,230

(22) Filed: Nov. 21, 2022

(65) Prior Publication Data

US 2023/0375168 A1 Nov. 23, 2023

(30) Foreign Application Priority Data

May 20, 2022 (CN) .......................... 202210552459.7

(51) Int. Cl.
*F21V 23/00* (2015.01)
*F21Y 115/10* (2016.01)

(52) U.S. Cl.
CPC ......... *F21V 23/006* (2013.01); *F21Y 2115/10* (2016.08)

(58) Field of Classification Search
CPC .............................. F21V 23/006; F21Y 2115/10
See application file for complete search history.

(56) References Cited

U.S. PATENT DOCUMENTS

| 5,313,055 | A | * | 5/1994 | Shiratsuki | ......... H01L 27/14678 |
| | | | | | 358/482 |
| 5,689,279 | A | * | 11/1997 | Nelson | ...................... G09F 9/33 |
| | | | | | 345/82 |
| 9,784,417 | B1 | * | 10/2017 | Springer | ............... F21V 23/006 |
| 10,208,945 | B1 | * | 2/2019 | Lan | .......................... F21V 23/02 |
| 10,582,616 | B1 | * | 3/2020 | Chen | ........................ H01L 33/62 |
| 10,851,949 | B1 | * | 12/2020 | Athalye | .................. F21V 29/83 |
| 2004/0113549 | A1 | * | 6/2004 | Roberts | ................ G02B 3/0056 |
| | | | | | 257/E23.087 |
| 2009/0080187 | A1 | * | 3/2009 | Chou | ...................... F21K 9/232 |
| | | | | | 257/89 |
| 2010/0264806 | A1 | * | 10/2010 | Yu | .......................... H05K 1/144 |
| | | | | | 313/317 |
| 2011/0101384 | A1 | * | 5/2011 | Betsuda | ................. H05K 3/242 |
| | | | | | 257/E33.066 |

(Continued)

*Primary Examiner* — Tsion Tumebo (57) ABSTRACT

Provided are a light emitting module and a spotlight. The light emitting module has a first substrate having an upper surface and a lower surface; an LED array and multiple first wires disposed on the upper surface of the first substrate. The LED array includes multiple first LEDs emitting light of a first color and multiple second LEDs emitting light of a second color different from the first color. A second substrate is disposed over or peripheral to the first substrate. A plurality of second wires provided on the second substrate. The second wires are respectively electrically connected with the first wires to connect first LEDs in series or in series-parallel and to connect the second LEDs in series or in series-parallel. The second wires are electrically connected with a driving apparatus configured to drive the first LEDs and the second LEDs to emit light through the first wires.

14 Claims, 7 Drawing Sheets

(56) References Cited

U.S. PATENT DOCUMENTS

| | | | | |
|---|---|---|---|---|
| 2011/0211351 A1* | 9/2011 | Van De Ven | ........... | F21V 29/74 |
| | | | | 362/249.02 |
| 2011/0303927 A1* | 12/2011 | Sanpei | ................... | F21V 29/76 |
| | | | | 257/E33.06 |
| 2013/0106747 A1* | 5/2013 | Choi | ..................... | G06F 3/0443 |
| | | | | 345/173 |
| 2014/0159077 A1* | 6/2014 | Kuenzler | ................ | F21V 29/54 |
| | | | | 257/89 |
| 2014/0334149 A1* | 11/2014 | Nolan | .................. | F21V 31/005 |
| | | | | 362/235 |
| 2014/0340890 A1* | 11/2014 | Hata | ....................... | F21V 29/74 |
| | | | | 438/27 |
| 2015/0016109 A1* | 1/2015 | Ogata | ................... | H05K 3/284 |
| | | | | 362/249.02 |
| 2015/0116997 A1* | 4/2015 | Tappert | ................. | A01G 9/249 |
| | | | | 362/249.03 |
| 2017/0125653 A1* | 5/2017 | Kawano | .................. | H01L 33/58 |
| 2018/0069162 A1* | 3/2018 | Abe | .................... | H01L 25/0753 |
| 2020/0263837 A1* | 8/2020 | Cao | ....................... | F21V 23/006 |

* cited by examiner

LIGHT EMITTING MODULE FOR SPOTLIGHT AND SPOTLIGHT

CROSS-REFERENCE TO RELATED APPLICATIONS

The present application claims priority of Chinese Patent Application No. 202210552459.7, filed on May 20, 2022, the entire contents of which are hereby incorporated by reference.

TECHNICAL FIELD

The present application relates to the field of spotlights, in particular to a light emitting module for spotlight and to a spotlight having the same.

DESCRIPTION OF THE PRIOR ART

A spotlight concentrates light sources at a point and emits light centrally, to form a light beam. Compared with conventional stage lights, the spotlights have the advantages of long lifetime, high luminous efficiency, diversification design, and large variety of colors, so the spotlights employing LED light sources have a large demand in the market.

LED spotlight generally includes a base on which a lens and a light source device are provided. The light source device includes a substrate and a plurality of LED beads disposed on the substrate. In the prior art, spotlights have LED beads that are densely arranged on the substrate, the LED beads generate large heat which is difficult to dissipate quickly, which may easily cause damage to the LED light source, thereby resulting in damage of the spotlight.

SUMMARY OF THE DISCLOSURE

To solve or at least partially mitigate the problems of the prior art, the present application provides a light emitting module for spotlight and a spotlight having the same.

In a first aspect, an embodiment of the present application provide a light emitting module for spotlight, including:
- a first substrate including an upper surface and a lower surface opposing each other;
- an LED array and a plurality of first wires disposed on the upper surface of the first substrate, wherein the LED array includes a plurality of first LEDs emitting light of a first color and a plurality of second LEDs emitting light of a second color different from the first color;
- a second substrate disposed over or peripheral to the first substrate; and
- a plurality of second wires provided on the second substrate, wherein the second wires are respectively electrically connected with the first wires to connect the plurality of first LEDs in series or in series-parallel, and to connect the plurality of second LEDs in series or in series-parallel, and wherein the second wires are electrically connected with a driving apparatus configured to drive the first LEDs and the second LEDs to emit light through the first wires.

In a second aspect, an embodiment of the present application provides a spotlight including the above-described light emitting modules for spotlight.

Embodiments of the present application provide a light emitting module for spotlight having a first substrate and a second substrate, the LEDs and the first wires are provided on an upper surface of the first substrate, a lower surface is not provided with wires to well dissipate heat from the LEDs, meanwhile the second substrate is provide with wires to enable electrical connection of each LED, so that the area of the first substrate can be reduced without affecting the electrical connection of each LED, and the spotlight using the light emitting module has the advantages of good heat dissipation, long lifetime, and low price.

BRIEF DESCRIPTION OF DRAWINGS

In the following description, each of the drawings is briefly described.

DESCRIPTION OF EMBODIMENTS

The Exemplary embodiments will now be described more fully with reference to the accompanying drawings. Exemplary embodiments may, however, be embodied in many forms and should not be construed as limited to the embodiments set forth herein; rather, these embodiments will make this application comprehensive and complete, and will fully convey the concept of the exemplary embodiments to those skilled in the art. Furthermore, the described features, structures, or characteristics may be combined in any suitable manner in one or more embodiments.

Unless otherwise specified, technical terms or scientific terms used in the present application should have common sense understood by persons with general skills in the field to which the present application belongs. "first" "second" and similar words used in the present application do not show any order, number or importance, but are merely used for distinguishing different components. "connect" or "connected" and similar words are not restricted to physical or mechanical connections, but can include electrical connections, whether direct or indirect.

In the description of the present application, it needs to be understood that the terms "above", "upper surface", "lower surface", "top surface", "bottom surface", and the like indicate an orientation or positional relationship based on that shown in the drawings, it is merely for convenience of description of the application and simplification of the description, it is not intended to indicate or imply that the devices or elements referred to must have a particular orientation, be constructed and operate in a particular orientation, and therefore cannot be construed as limiting the present application.

Referring to FIGS. 1-4, an embodiment of a light emitting module is shown, which includes a first substrate having an upper surface and a lower surface opposing each other; an LED array and a plurality of first wires disposed on the upper surface of the first substrate, wherein the LED array includes a plurality of first LEDs and a plurality of second LEDs, and the first LEDs emit light of a first color and the second LEDs emit light of a second color different from the first color; a second substrate disposed over or peripheral to the first substrate; and a plurality of second wires provided on the second substrate, wherein the second wires are respectively electrically connected with the first wires, to connect the plurality of first LEDs in series or in series-parallel, and to connect the plurality of second LEDs in series or in series-parallel. The second wires are electrically connected with a driving apparatus configured to drive the first LEDs and the second LEDs, through the first wires, to emit light. The embodiment of the present application provides a light emitting module for spotlight having a first substrate and a second substrate, the LEDs and the first wires are provided on an upper surface of the first substrate, a lower surface is not provided with wires to well dissipate heat from the LEDs, meanwhile the second substrate is provide with the second wires to enable electrical connection of each LED, so that the area of the first substrate can be reduced without affecting the electrical connection of each LED, and the spotlight using the light emitting module has the advantages of good heat dissipation, long lifetime, and low price.

In certain embodiments, the thermal conductivity of the first substrate is greater than the thermal conductivity of the second substrate. In some embodiments of the present application, the first LEDs and the second LEDs are arranged on the first substrate with high thermal conductivity, such as aluminum nitride substrate, which can better dissipate the heat of the LEDs and improve the heat dissipation performance.

In order to achieve the diversity of colors, in an embodiment of the present application, LEDs of at least two colors may be provided. In the embodiment illustrated in FIGS. 1-4, a plurality of first LEDs 204 that emit red light and a plurality of second LEDs 206 that emit green light are provided. The plurality of first LEDs 204 and the plurality of second LEDs 206 are arranged in a matrix on an upper surface of a first substrate 202, the plurality of first LEDs 204 and the plurality of second LEDs 206 are mounted on the first substrate 202 at a high density and adjacent to each other. By placing multiple LEDs close to each other in high density, LED gaps can be prevented from appearing in a projected image.

Figure 1:
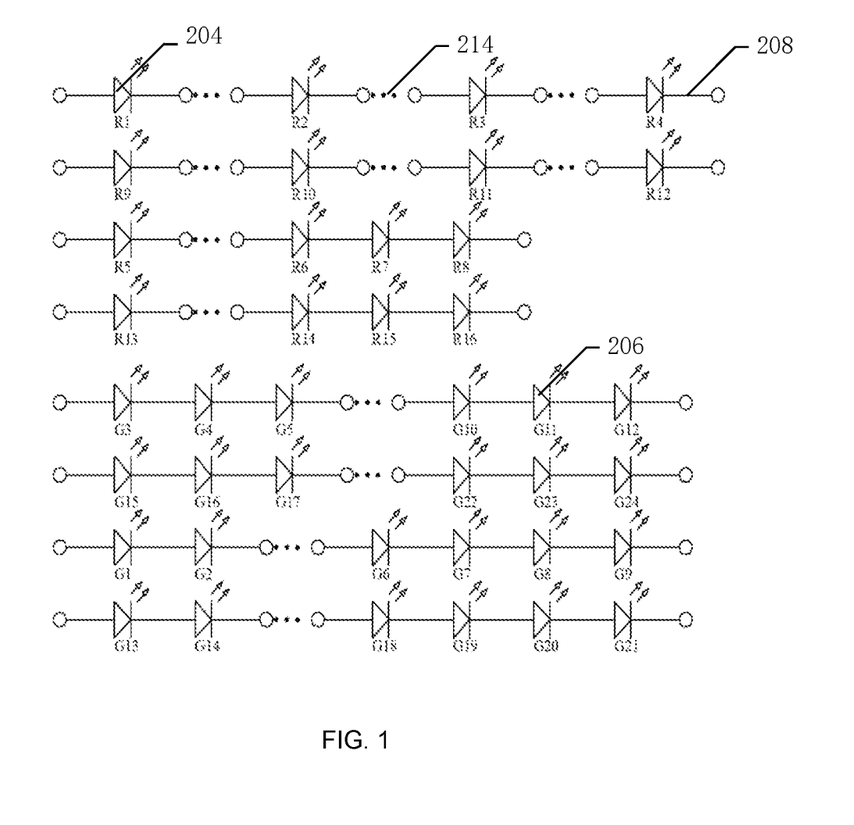
FIG. 1 is a schematic diagram of a lighting module for spotlight according to a first embodiment of the present application.
Figure 2:
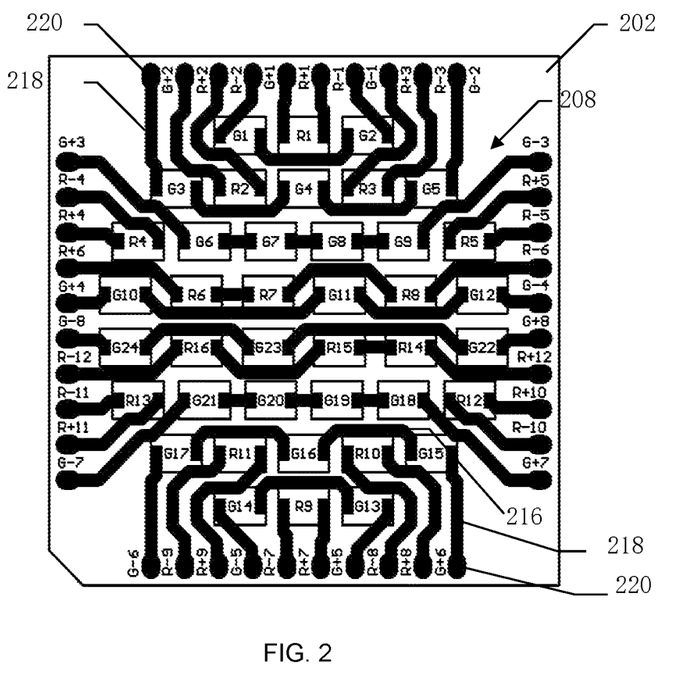
FIG. 2 is a top view of a first substrate according to the first embodiment of the present application.

An arrangement of the plurality of red LEDs and the plurality of green LEDs on the first substrate 202 is shown in FIG. 2. FIG. 2 is a structural schematic view of the arrangement of multiple LEDs in a light emitting module for spotlight. In particular, the plurality of red LEDs and the plurality of green LEDs are distributed on the substrate 202 in such a manner that different colors are mixed. The plurality of first LEDs 204 and the plurality of second LEDs 206 are arranged in eight rows from top to bottom, and an overall outer profile of the projection of the arrangement of all LEDs on the substrate 202 is circular. In this embodiment, sixteen red first LEDs 204 and twenty four green second LEDs 206 are provided, with the red LEDs indicated by R1-R16 and the green LEDs indicated by G1-G24, as shown in FIG. 1.

Specifically, the first row includes three LEDs, i.e., a green LED G1, a red LED R1, and a green LED G2 arranged in sequence. The second row includes five LEDs, i.e., a green LED G3, a red LED R2, a green LED G4, a red LED R3, and a green LED G5 arranged in sequence. The third row includes six LEDs, i.e., a red LED R4, a green LED G6, a green LED G7, a green LED G8, a green LED G9, and a red LED R5 arranged in sequence. The fourth row includes six LEDs, i.e., a green LED G10, a red LED R6, a red LED R7, a green LED G11, a red LED R8, and a green LED G12 arranged in sequence. The fifth row provides six LEDs i.e., a green LED G24, a red LED R16, a green LED G23, a red LED R15, a red LED R14, and a green LED G22 arranged in sequence. The sixth row provides six LEDs, i.e., a red LED R13, a green LED G21, a green LED G20, a green LED G19, a green LED G18, and a red LED R12 arranged in sequence. The seventh row includes five LEDs, i.e., a green LED G17, a red LED R11, a green LED G16, a red LED R10, and a green LED G15 arranged in sequence. The eighth row includes three LEDs, i.e., a green LED G14, a red LED R9, and a green LED G13 arranged in sequence.

It should be noted that disposing a plurality of LEDs on the first substrate 202 in the above color arrangement allows for good uniformity of light spot output by a light emitting module for spotlight and no significant color patches or dark regions will be present. It is also within the scope of the present application for other arrangements to achieve the same or similar effect. In other embodiments, in order to make the light module output uniform light spot, the overall external contour of the projections of all LEDs on the first substrate may be arranged in a regular polygon in addition to a circular. Meanwhile, it can be seen in FIG. 2 that the arrangement of LEDs of different colors on the first substrate 202 is not uniformly alternated, that is, it is not necessary to set a number of red LEDs and then set green LEDs with the same number, the arrangement of the individual LEDs on the first substrate 202 may be arranged according to practical circumstances. The specific arrangement of LEDs in the figure is only an example and cannot be understood as the restriction of this application.

Due to the high density of multiple LEDs mounted on the first substrate 202 with good heat dissipation, in the embodiments of the present application, the multiple LEDs and the wires connecting each LED are only disposed on the upper surface of the first substrate 202. No wire is set on the lower surface of the first substrate 202, which can ensure the good heat dissipation of the first substrate 202. In order to properly connect the respective LED, the wires on the first substrate 202 for connecting the respective LEDs need to be arranged at the periphery of the LEDs. However, since the red LEDs R1-R16 and green LEDs G1-G24 are mounted on the first substrate 202 with a high density, the spacing between the LEDs becomes narrow. In order to ensure the width and gap of the wires, there is a need for a larger area of the first substrate for arranging the large number of LEDs in less density, which results in increased costs and large volume of the LED array.

Figure 3A:
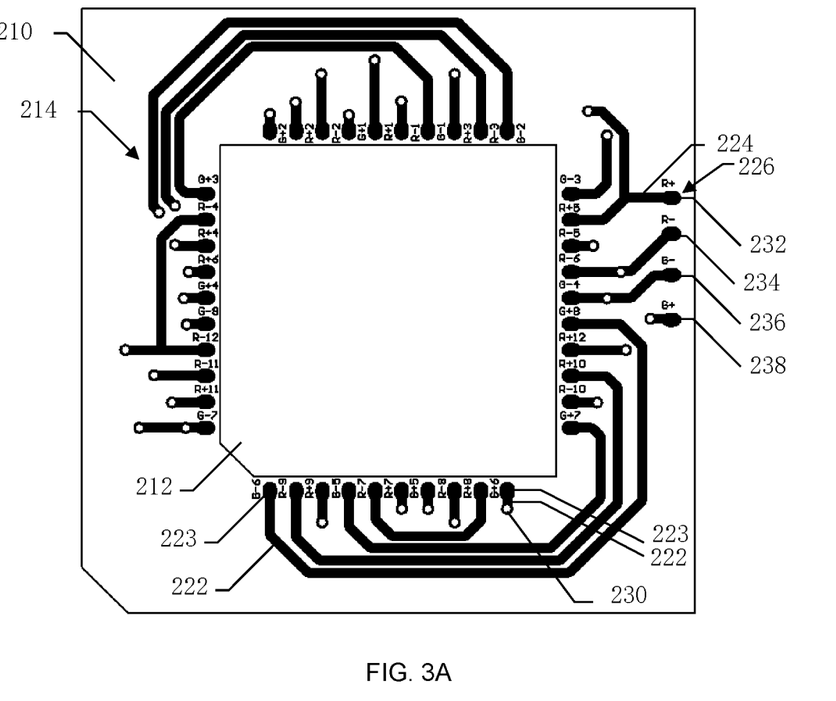
FIG. 3A is a top view of a second substrate according to the first embodiment of the present application.
Figure 3B:
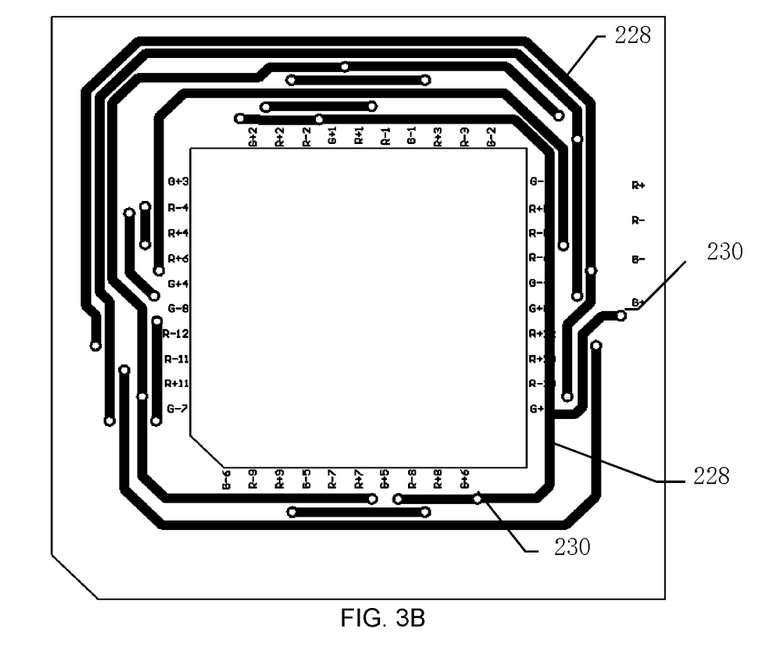
FIG. 3B is a bottom view of the second substrate according to the first embodiment of the present application.

To reduce the area of the first substrate to save costs, the present disclosure also provides a second substrate 210 shown in FIGS. 3A and 3B. The second substrate 210 is disposed over or peripherally to the first substrate. Referring to FIG. 3A, in certain embodiments, the second substrate 210 forms an opening 212 corresponding to the LED array to expose the LED array, the opening 212 extends through the second substrate 210 and corresponds to the array formed by the first LEDs 204 and the second LEDs 206, i.e., the opening 212 is positioned above the LED array. The shape of the opening 212 in FIG. 3A conforms to the shape of the first substrate, but in other embodiments, the shape of the opening is not limited as long as the light of each LED can be sufficiently exposed.

In an embodiment, the first substrate may be an aluminum nitride substrate and the second substrate may be a resin substrate. In other embodiments, the first substrate may be made of other materials. The second substrate is provided with a plurality of second wires 214 that are connected with the first wires 208 correspondingly to connect the plurality of first LEDs and the plurality of second LEDs in series or in series-parallel, respectively.

As used herein, the term "substrate" refers to a mounting member or element on which, in which, or over which, a plurality of solid state light emitters (such as the LEDs of embodiments of the present application), may be arranged, supported, and/or mounted. The substrate may be, for example, a component substrate, a chip substrate, or a sub-panel substrate. As used in this application, the substrate may include, for example: a printed circuit board (PCB) and/or related components (e.g., including but not limited to a metal core printed circuit board (MCPCB), a flexible circuit board, a dielectric laminate, a ceramic-based substrate, etc.); and a high reflectivity ceramic (e.g., alumina) support panel. The first substrate and the second substrate of the present application can be made of suitable materials as required, the overall principle is that the thermal conductivity of the first substrate is higher than that of the second substrate, to achieve good heat dissipation results while saving costs.

With reference to FIGS. 2, 3A and 3B, the final connection states of red LEDs R1-R16 and green LEDs G1-G24 are as shown in the schematic diagram of FIG. 1. The red LEDs R1-R4 are connected in series to form a first branch, R5-R8 are connected in series to form a second branch, R9-R12 are connected in series to form a third branch, and R13-R16 are connected in series to form a fourth branch, then the four branches are connected in parallel, i.e., the anodes of R1, R9, R5 and R13 are connected together and the cathodes of R4, R12, R8 and R16 are connected together. Similarly, the green LEDs G3, G4, G5, G10, G11 and G12 are connected in series to form a fifth branch, G15, G16, G17, G22, G23 and G24 are connected in series to form a sixth branch, G1, G2, G6, G7, G8 and G9 are connected in series to form a seventh branch, and G13, G14, G18, G19, G20 and G21 are connected in series to form a eighth branch, then the four branches are connected in parallel, i.e., the anodes of G3, G15, G1 and G13 are connected together and the cathodes of G12, G24, G9 and G21 are connected together. The above-described connection is an exemplary connection, and in other embodiments, the LEDs of the same color may be connected in series or in series-parallel as required, which will be appreciated by those of ordinary skill in the art, and will not be described herein.

FIGS. 2, 3A, and 3B illustrate a particular manner of connection for the plurality of first LEDs 204 and the plurality of second LEDs 206 on the first substrate 202 and on the second substrate 210. The plurality of first wires 208 of FIG. 2 includes: a plurality of first abutting wires 216, each of the first abutting wires 216 connecting a cathode of one LED with an anode of another LED of a same color; and a plurality of first jumping wires 218 having a first end and a second end, the first end being providedwith a first connection point 220 connected with one corresponding second wire and the second end being connected with an anode or cathode of one of the LEDs. Referring to FIG. 3A, the plurality of second wires 214 includes a plurality of second jumping wires 222, at least one end of each second jumping wire 222 being provided with a second connection point 223 which is connected with one corresponding first wire 208; and a plurality of peripheral wires 224, each peripheral wire having opposing a first end and a second end, the first end of each peripheral wire being provided with a peripheral connection point 226 connected with a driving apparatus (FIG. 4) and the second end of each peripheral wire being connected with one corresponding second jumping wire 222. The second jumping wire 222, the second connection point 223, the peripheral wire 224, and the peripheral connection point 226 are disposed on an upper surface of the second substrate 210. When the wiring is relatively simple, the second wire is arranged on only one surface of the second substrate 210 and can connect with the first wire 208 to enable proper connection of the individual LEDs.

When the number of LEDs is large and the wiring is relatively complex, the plurality of second wires 214 further includes a plurality of intermediate wires 228, to connect the plurality of peripheral wires 224 with corresponding second jumping wire wires 222, respectively. In FIG. 3B, the plurality of intermediate wires 228 are provided on the lower surface of the second substrate 210, at least one end of each intermediate wire 228 is provided with a through-wire 230 extending through the upper surface and the lower surface of the second substrate 210 and connecting one intermediate wires 228 with corresponding one second jumping wire 222 or one peripheral wires 224. In this embodiment, although the second jumping wire 222, the second connection point 223, the peripheral wire 224, and the peripheral connection point 226 are disposed on the upper surface of the second substrate 210, and the plurality of intermediate wires 228 are disposed on the lower surface of the second substrate 210, but in other embodiments, they are not limited to that location, as long as they can cooperate with the first wires to achieve proper electrical connection. For spatial reasons, each element in FIGS. 2, 3A, and 3B is labeled with only one to two reference numerals, but the actual reference to other non-labeled elements may be understood by those skilled in the art from the description.

Connections between G15, G16, G17, G22, G23, G24 are described in detail below. On one hand, the anode of G15 is connected to the first end of one first jumping wire 218, the second end of the first jumping wire 218 is provided with a first connection point 220, the first connection point 220 (G 6) is connected to one second wire on the second substrate, in particular the first connection point 220 (G 6) is connected via welding or wiring to the second connection point 223 (G 6) shown in FIG. 3A, the second connection point 223 is connected to one end of one second jumping wire 222, the other end of the second jumping wire 222 is connected to a corresponding through-wire 230. The through-wire 230 extends through the upper surface and the lower surface of the second substrate 210, so that the jumping wire 222 on the upper surface is connected to one end of one intermediate wire 228 on the lower surface (shown in FIG. 3B), the other end of the intermediate wire 228 is in turn connected with one end of one peripheral connection line 224 on the upper surface via another through-wire 230, the other end of the peripheral wire 224 is connected with one peripheral connection point 226, here in particular with a second positive input 238. On the other hand, the cathode of G15 is connected with the anode of G16 through one first abutting wire 216, the cathode of G16 is connected with the anode of G17 through another first abutting wire 216, the cathode of G17 is connected with one second wire through one first jumping wire and one first connection point (G−6), the specific connection is similar to that of the anode of G15, specific connections are shown in FIGS. 3A and 3B, which will not be described here. The second wiring is connected with one first connection point (G+8) on the first substrate by welding or other means through one second connection point 223 (G+8), electrical connection of the cathode of G17 to the anode of G22 is thus achieved, and G22, G23 and G24 are successively connected through the corresponding first abutting wires 216, and the cathode of G24 is finally connected to a second negative input 238 on the second substrate via one first jumping wire 218 and one first connection point 220 (G−8), also the specific connection process is not described in detail.

Figure 4:
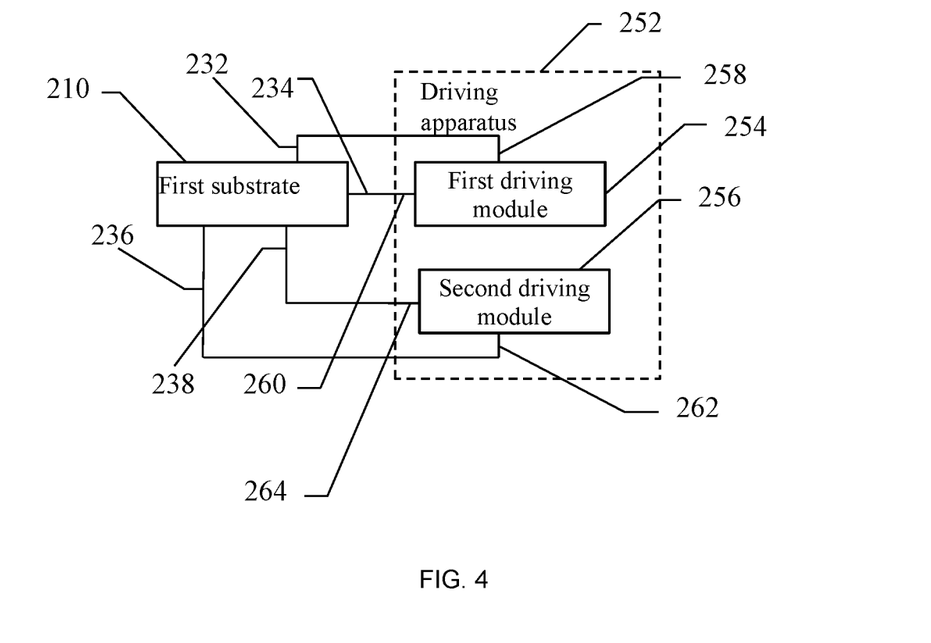
FIG. 4 is a block diagram of the second substrate connected to a driving apparatus according to the first embodiment of the present application.
Figure 5:
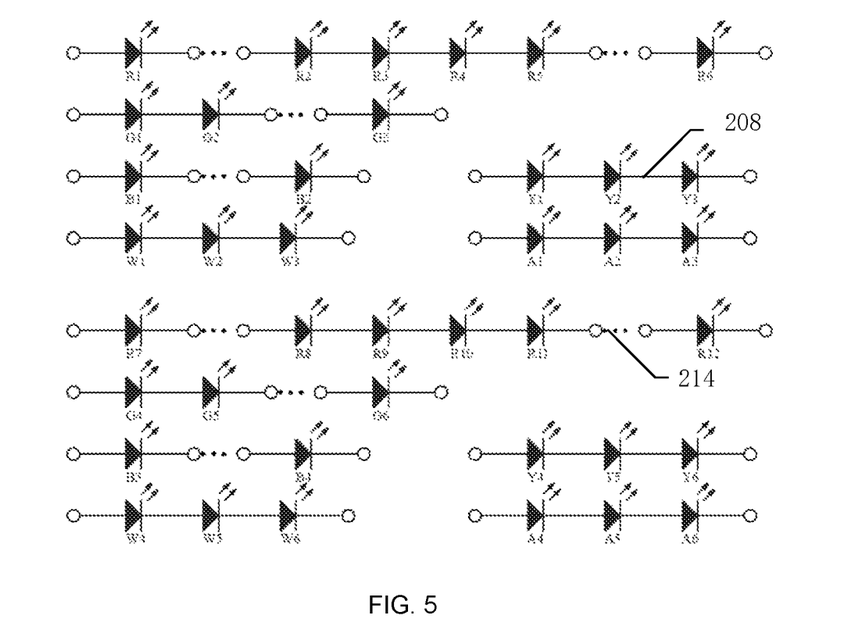
FIG. 5 is a schematic diagram of a lighting module for spotlight according to a second embodiment of the present application.

Through the first substrate, the second substrate, and the correspondingly provided first wires and second wires, the red LEDs R1-R16 and the green LEDs G1-G24 may be properly connected and be connected with the driving apparatus 252 shown in FIG. 4 through the peripheral connection points. In this embodiment, the peripheral connection points 226 include a first positive input 232, a first negative input 234, a second positive input 236, and a second negative input 238. The anode of a beginning first red LED (R1) is connected to a first end of the first positive input 232, and a second end of the first positive input 232 is connected to an anode 258 of a first driving module 254 of the driving apparatus 252. The cathode of the last red LED (R16) is connected to a first end of the first negative input 234 and a second end of the first negative input 234 is connected to a cathode 260 of the first driving module 254 of the driving apparatus 252. The anode of a beginning green LED (G1) is connected to a first end of the second positive input 236, and a second end of the second positive input 236 is connected to an anode 262 of a second driving module 256 of the driving apparatus 252. And the cathode of a last green LED (G24) is connected to a first end of the second negative input 238, and a second end of the second negative input 238 is connected to a cathode 264 of the second driving module 256 of the driving apparatus 252. The first driving module 254 drives the first LEDs to emit light and the second driving module 256 drives the second LEDs to emit light.

In the above embodiment, the second substrate has only the upper surface and the lower surface, and in other light emitting modules having more LEDs, the second substrate may include a plurality of layers, the through-wires connect any two surfaces of the layers to achieve the proper arrangement of the second wires. The first connection point, the second connection point, and the peripheral connection point may be connection pads, mounting pads, or electrode pads. The through-wire may be a through-hole. The first wires arranged on the upper surface of the first substrate do not intersect each other to enable electrical insulation of each first wire. Likewise, the second wires disposed on the second substrate do not intersect each other.

While the above embodiments describe the light emitting module for spotlight with two colors, in other embodiments, LEDs of many different colors may be used and the various different colors of light may be mixed to meet needs of various colors of the spotlight. The lighting module for spotlight of the present application may further include at least one of the following: a plurality of third LEDs, a plurality of fourth LEDs, a plurality of fifth LEDs and a plurality of sixth LEDs disposed on the upper surface of the first substrate. Particular embodiments of the present application may provide LEDs in three, four, five, six, or even more colors according to requirement, the number of colors is not limited.

The LED referred to herein should be understood to include any electroluminescent diode or other type of carrier injection/bonding-based system capable of generating radiation in response to an electrical signal. Thus, the term LED includes, but is not limited to, various semiconductor-based structures, light emitting polymers, organic light emitting diodes (OLED), electroluminescent strips, and the like, which emit light in response to current. In particular, the term LED refers to light emitting diodes of all types that may be configured to generate radiation in one or more of the infrared spectrum, ultraviolet spectrum, and various portions of the visible spectrum (generally including radiation wavelengths ranging from about 400 nm to about 700 nm). Some examples of LEDs include, but are not limited to, various types of infrared LEDs, ultraviolet LEDs, red LEDs, blue LEDs, green LEDs, and white LEDs (discussed further below).

The term "color" is commonly used to refer to a property of radiation perceived by the observer, and the term "different colors" implies two different spectra with different principal wavelengths and/or bandwidths. Further, "color" may be used to denote white and non-white light. The use of a specific color to describe an LED or the light emitted by the LED represents a specific range of dominant wavelengths associated with that particular color. In particular, when used to describe an LED or light emitted by an LED, the term "red" refers that the LED emits light having a dominant wavelength between 610 nm and 750 nm; the term "green" refers that the LED emits light having a dominant wavelength between 495 nm and 570 nm; the term "blue" refers that the LED emits light having a dominant wavelength between 430 nm and 490 nm; and the term "white" refers to the LED emits light having a dominant wavelength between 450-460 nm. Further, the red LED includes: a dark red LED, a bright red LED, and a tangerine LED; the green LED includes: a yellow-green LED, a bright green LED, and a blue-green LED; the blue LED includes: a right blue LED and a royal blue LED; and the yellow LED includes an amber LED. The dark red LED has a wavelength in the range of 650 nm to 670 nm, the bright red LED has a wavelength in the range of 624 nm to 634 nm, and the tangerine LED has a wavelength in the range of 614 nm to 624 nm. The yellow-green LED has a wavelength in the range of 565 nm to 569 nm, the bright green LED has a wavelength in the range of 520 nm to 540 nm, and the blue-green LED has a wavelength in the range of 490 nm to 510 nm. The bright blue LED has a wavelength in the range of 465 nm to 485 nm and the royal blue LED has a wavelength in the range of 440 nm to 460 nm. The amber LED has a wavelength in the range of 584 nm to 595 nm.

Figure 6:
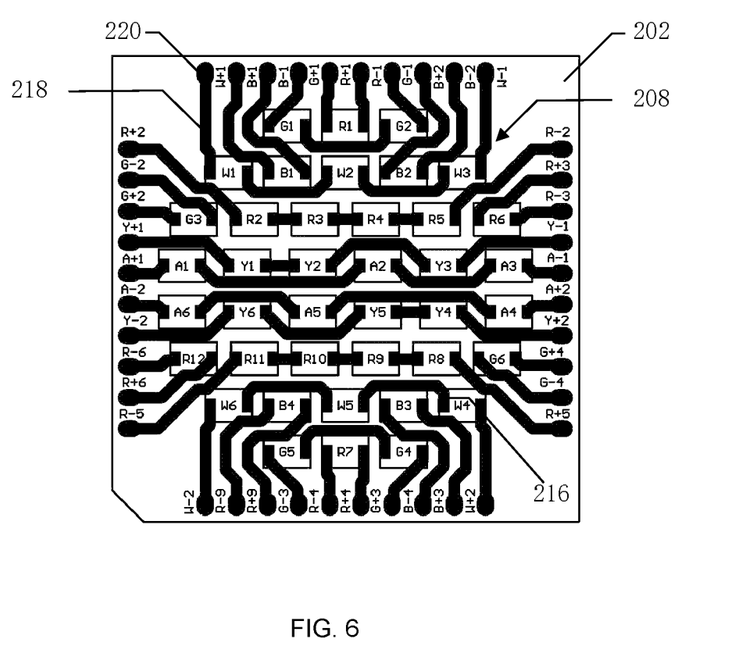
FIG. 6 is a top view of a first substrate according to the second embodiment of the present application.
Figure 7A:
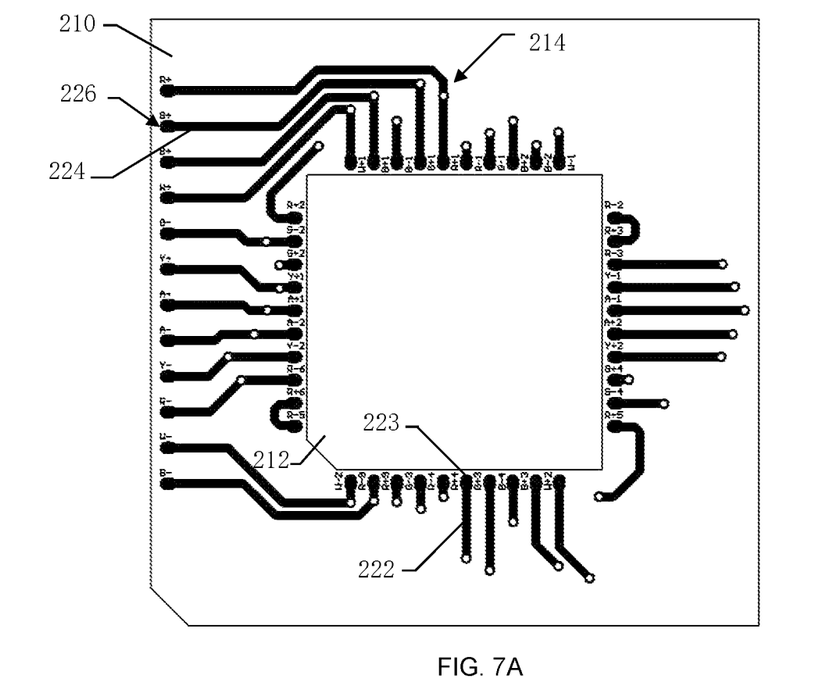
FIG. 7A is a top view of a second substrate according to the second embodiment of the present application.
Figure 7B:
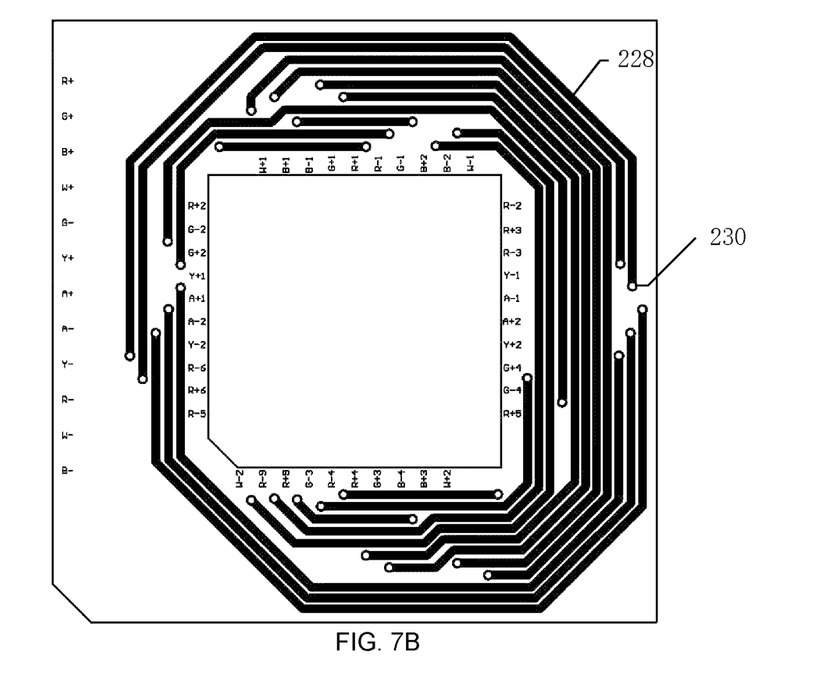
FIG. 7B is a bottom view of the second substrate according to the second embodiment of the present application.

In other embodiments of the present application, LEDs of suitable color can be selected from above to implement the light emitting module for spotlight. Referring to FIGS. 5-7B, another embodiment of the light emitting module for spotlight is provided. The light emitting module uses LEDs of six colors, which are red LEDs R1-R6, green LEDs G1-G6, blue LEDs B1-B4, yellow LEDs Y1-Y6, white LEDs W1-W6, and orange LEDs A1-A6, respectively. The connection manner of the LEDs can be referred to in FIG. 5, while the arrangement of the LEDs on the first substrate 202 is shown in FIG. 6, six red LEDs, six green LEDs, four blue LEDs, six yellow LEDs, six white LEDs, and six orange LEDs are arranged on the first substrate 202 in such a manner that different colors are mixed, the particular arrangement is similar to the abovementioned embodiment and does not described again here. Required electrical connections of the LEDs with six colors are achieved through the first wires 208 on a first substrate and the second wires 214 on a second substrate. The specific connection mode can be understood by referring to the description of the previous embodiment and the diagrams in FIG. 6, FIG. 7A and FIG. 7B. Technical personnel in this field can understand the implementation process of this embodiment. For the sake of brevity, the description will not be repeated here.

The total connection mode of individual LEDs is that: LEDs emitting the same color light are connected in series to form at least one LED string, then the LED strings of the same color can be connected in series or parallel, an anode of the LED strings with a certain color is connected to an anode of a corresponding driving module, and a cathode of the LED strings with the certain color is connected to a cathode of the corresponding driving module. By controlling the respective driving modules to drive the LEDs with corresponding color to emit light of single color, or to emit light of multiple colors for mixing, the spotlight is caused to emit light of a desired color.

Figure 8:
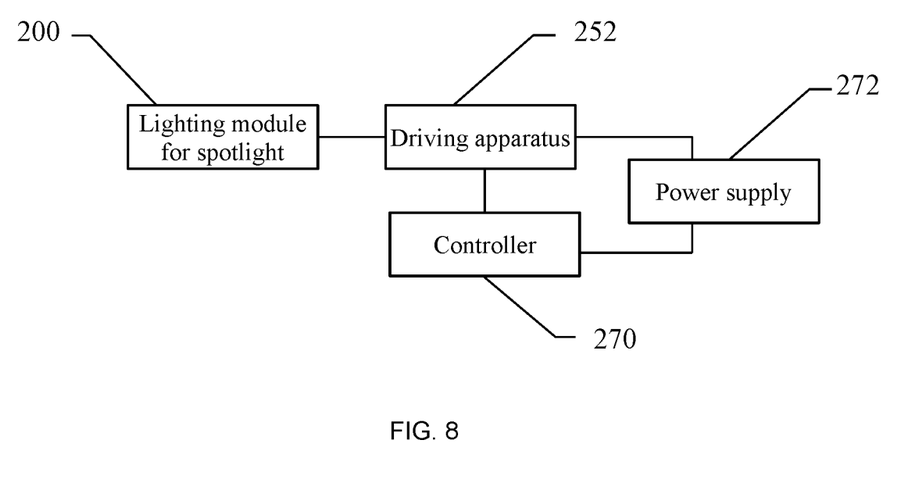
FIG. 8 is a block diagram of a spotlight of the second aspect of the present application.

In another aspect of the present application, a spotlight is also provided. Referring to FIG. 8, the spotlight includes: a light emitting module 200 for spotlight according to any of the above embodiments; a driving apparatus 252 connected to the light emitting module 200 for driving the light emitting module to emit light; a controller 270 connected to the driving device 252 for controlling the driving apparatus 252, and a power supply 272 connected to and supplying power to the driving device 252 and the controller 270. The spotlight further includes parts such as a heat sink, a housing and the like, which may be well known to the person skilled in the art and will not be described in detail here.

The term "spotlight" as used herein may be a device or apparatus that illuminates an area or a volume; or devices used for edge or backlight lighting (e.g., backlight posters, signage, LCD displays), outdoor lighting, security lighting, landscape lighting, track lighting, work lighting, specialty lighting, rope lights, ceiling fan lighting, archival/artistic display lighting, mirror/dresser lighting, high booth lighting, low booth lighting, or any other lighting devices.

The phrase "and/or," as used herein in the specification and in the claims, should be understood to mean "either or both" of the elements so conjoined, i.e., elements that are conjunctively present in some cases and disjunctively present in other cases. Multiple elements listed with "and/or" should be construed in the same fashion, i.e., "one or more" of the elements so conjoined. Other elements may optionally be present other than the elements specifically identified by the "and/or" clause, whether related or unrelated to those elements specifically identified. Thus, as a non-limiting example, a reference to "A and/or B", when used in conjunction with open-ended language such as "comprising" can refer, in one embodiment, to A only (optionally including elements other than B); in another embodiment, to B only (optionally including elements other than A); in yet another embodiment, to both A and B (optionally including other elements) etc.

It will be understood that when an element such as a layer, region or substrate is referred to as being "on" another element, it can be directly on the other element or intervening elements may be present. Furthermore, relative terms, such as "above," "upper," "upper surface," "top," "lower," or "lower surface," are used herein to describe one structure's or portion's relationship to another structure or portion as illustrated in the figures. It will be appreciated that relative terms such as "above," "upper," "upper surface," "top," "lower," or "lower surface" are intended to encompass different orientations of the device in addition to the orientation depicted in the figures. For example, if the device in the figures is turned over, structure or portions described as "above" other structures or portions would now be oriented "below" the other structures or portions. Thus, the exemplary term "above" can encompass both above and below orientations.

It should be noted that, in order to highlight the innovative part of this application, the above embodiments of this application do not introduce the units/modules that are not closely related to the solution of the technical problems proposed in this application, which does not mean that there are no other units/modules in the above embodiments.

It should s also to be understood that the above-described embodiments are merely exemplary embodiments for the purpose of describing the principles of the present application, and that the present application is not limited thereto. Various changes and modifications may be made by those of ordinary skill in the art without departing from the spirit and nature of this application, which are also included within the scope of this application. Therefore, although the application has been described with reference to specific examples, it will be appreciated by those skilled in the art that the application may be embodied in many other forms. Those skilled in the art will likewise understand that features of the various examples described can be combined with other combinations.

The invention claimed is:

1. A light emitting module for spotlight, comprising:
a first substrate comprising an upper surface and a lower surface opposing each other;
an LED array and a plurality of first wires only disposed on the upper surface of the first substrate, wherein the LED array includes a plurality of first LEDs emitting light of a first color and a plurality of second LEDs emitting light of a second color different from the first color;
a second substrate disposed over or peripheral to the first substrate; and
a plurality of second wires provided on the second substrate, wherein the second wires are respectively electrically connected with the first wires to connect the plurality of first LEDs in series or in series-parallel, and to connect the plurality of second LEDs in series or in series-parallel, and wherein the second wires are electrically connected with a driving apparatus configured to drive the first LEDs and the second LEDs to emit light through the first wires,
wherein no wire is set on the lower surface of the first substrate and no LED is disposed on the second substrate;
wherein a thermal conductivity of the first substrate is greater than a thermal conductivity of the second substrate, the first LEDs and the second LEDs are distributed on the first substrate in such a manner that different colors are mixed, and are placed close to each other to prevented LED gaps from appearing in a projected image;
wherein he plurality of first LEDs and the plurality of second LEDs are arranged in eight rows from top to bottom, and an overall outer profile of the projection of the arrangement of all LEDs on the first substrate is circular; and
wherein sixteen red first LEDs (204) and twenty four green second LEDs (206) are provided on the first substrate, the first row includes three LEDs, i.e., a green LED (G1), a red LED (R1), and a green LED (G2) arranged in sequence, the second row includes five LEDs, i.e., a green LED (G3), a red LED (R2), a green LED (G4), a red LED (R3), and a green LED (G5) arranged in sequence, the third row includes six LEDs, i.e., a red LED (R4), a green LED (G6), a green LED (G7), a green LED (G8), a green LED (G9), and a red LED (R5) arranged in sequence, the fourth row includes six LEDs, i.e., a green LED (G10), a red LED (R6), a red LED (R7), a green LED (G11), a red LED (R8), and a green LED (G12) arranged in sequence, the fifth row provides six LEDs i.e., a green LED (G24), a red LED (R16), a green LED (G23), a red LED (R15), a red LED (R14), and a green LED (G22) arranged in sequence, the sixth row provides six LEDs, i.e., a red LED (R13), a green LED (G21), a green LED (G20), a green LED (G19), a green LED (G18), and a red LED (R12) arranged in sequence, the seventh row includes five LEDs, i.e., a green LED (G17), a red LED (R11), a green LED (G16), a red LED (R10), and a green LED (G15) arranged in sequence, the eighth row includes three LEDs, i.e., a green LED (G14), a red LED (R9), and a green LED (G13) arranged in sequence.

2. The light emitting module for spotlight of claim 1, wherein the second substrate comprises an opening corresponding to the LED array for exposing the LED array.

3. The light emitting module for spotlight of claim 1, wherein each LED has an anode and a cathode, and wherein the plurality of first wires comprises:
a plurality of first abutting wires, each first abutting wire connecting the cathode of one LED with the anode of another LED emitting light of a same color as the one LED; and
a plurality of first jumping wires, each first jumping wire having a first end and a second end, wherein the first end is provided with a first connection point connected to one corresponding second wire, and the second end is connected to the anode or cathode of one of the LEDs.

4. The light emitting module for spotlight of claim 1, wherein the plurality of second wires comprises:
a plurality of second jumping wires, at least one end of each second jumping wire being provided with a second connection point, and the second connection point is connected with one corresponding first wire; and
a plurality of peripheral wires, each peripheral wire having opposing a first end and a second end, wherein the first end of each peripheral wire is provided with a peripheral connection point connected with the driving apparatus, and the second end of each peripheral wire is connected with one corresponding second jumping wire.

5. The light emitting module for spotlight of claim 4, wherein the plurality of second wires further comprises a plurality of intermediate wires connecting the plurality of peripheral wires with corresponding second jumping wires, respectively.

6. The light emitting module for spotlight of claim 5, wherein at least one end of each intermediate wire is provided with a through-wire extending through an upper surface and a lower surface of the second substrate and connecting one intermediate wire with corresponding one second jumping wire or one peripheral wire.

7. The light emitting module for spotlight of claim 6, wherein the second substrate comprises a plurality of layers and the through-wires connect any two surfaces of the layers.

8. The light emitting module for spotlight of claim 4, wherein the peripheral connection points comprise:
a first positive input having a first end and a second end, wherein the first end of the first positive input is connected to the anode of a beginning LED of the plurality of first LEDs via a corresponding first wire and a corresponding second wire, and the second end of the first positive input is connected to the anode of a first driving module of the driving apparatus;
a first negative input having a first end and a second end, wherein the first end of the first negative input is connected to the cathode of a last LED of the plurality of first LEDs via a corresponding first wire and a corresponding second wire, and the second end of the first negative input is connected to the cathode of the first driving module of the driving apparatus;
a second positive input having a first end and a second end, wherein the first end of the second positive input is connected the anode of a beginning LED of the plurality of second LEDs via a corresponding first wire and a corresponding second wire, and the second end of the second positive input is connected to the anode of a second driving module of the driving apparatus; and
a second negative input having a first end and a second end, wherein the first end of the second negative input is connected to the cathode of a last LED of the plurality of second LEDs through a corresponding first wire and a corresponding second wire, and the second end of the second negative input is connected to the cathode of the second driving module of the driving apparatus.

9. The light emitting module for spotlight of claim 1 further comprising at least one of the following: a plurality of third LEDs, a plurality of fourth LEDs a plurality of fifth LEDs and a plurality of sixth LEDs disposed on the upper surface of the first substrate.

10. The light emitting module for spotlight of claim 1, wherein the first substrate is an aluminum nitride substrate.

11. The light emitting module for spotlight of claim 10, wherein the second substrate is a resin substrate.

12. A spotlight comprising the light emitting module for spotlight of claim 1.

13. The light emitting module for spotlight of claim 2, wherein the opening extends through the second substrate and corresponds to the array formed by the first LEDs and the second LEDs, the shape of the opening conforms to the shape of the first substrate.

14. The light emitting module for spotlight of claim 9, wherein the first LEDs, the second LEDs, the third LEDs, the fourth LEDs, the fifth LEDs and the sixth LEDs are red LEDs, green LEDs, blue LEDs, yellow LEDs, white LEDs, and orange LEDs, respectively.

* * * * *